(12) United States Patent
Singer (10) Patent No.: US 12,429,763 B2
(45) Date of Patent: Sep. 30, 2025

(54) SACRIFICIAL NANOTRANSFER LITHOGRAPHY FOR THE METALIZATION OF PLASTICS

(71) Applicant: Rutgers, the State University of New Jersey, New Brunswick, NJ (US)

(72) Inventor: Jonathan P. Singer, Cranford, NJ (US)

(73) Assignee: Rutgers, the State University of New Jersey, New Brunswick, NJ (US)

( * ) Notice: Subject to any disclaimer, the term of this patent is extended or adjusted under 35 U.S.C. 154(b) by 816 days.

(21) Appl. No.: 17/616,312

(22) PCT Filed: Jun. 3, 2020

(86) PCT No.: PCT/US2020/035905
§ 371 (c)(1),
(2) Date: Dec. 3, 2021

(87) PCT Pub. No.: WO2020/247483
PCT Pub. Date: Dec. 10, 2020

(65) Prior Publication Data
US 2022/0326609 A1    Oct. 13, 2022

Related U.S. Application Data

(60) Provisional application No. 62/856,426, filed on Jun. 3, 2019.

(51) Int. Cl.
*G03F 7/00*         (2006.01)
*B82Y 30/00*        (2011.01)
(Continued)

(52) U.S. Cl.
CPC ............. *G03F 7/0002* (2013.01); *C25D 1/00* (2013.01); *C25D 5/56* (2013.01); *B82Y 30/00* (2013.01); *B82Y 40/00* (2013.01)

(58) Field of Classification Search
None
See application file for complete search history.

(56) References Cited

U.S. PATENT DOCUMENTS 10,436,946 B2 * 10/2019 Free ..................... G02B 1/118
2007/0092431 A1    4/2007 Resasco et al.
(Continued)

FOREIGN PATENT DOCUMENTS

DE    102015117834 A1 *  4/2017  ......... B81C 1/00031

OTHER PUBLICATIONS

International Search Report and Written Opinion for International Patent Application No. PCT/US20/35905 dated Sep. 9, 2020, pp. 1-13.

*Primary Examiner* — Louis J Rufo
(74) *Attorney, Agent, or Firm* — Wolter Van Dyke Davis, PLLC; Eugene J. Molinelli; Michael W. Taylor (57) ABSTRACT

Processes for producing layered components that may include depositing a strike layer on a substrate; forming a nanomaterial layer on the strike layer, the nanomaterial layer having a nanotextured surface comprising a plurality of nanofeatures; embedding a polymeric material at least partially within the nanotextured surface; and separating the strike layer from the substrate to obtain the layered component. Layered components that may include a nanomaterial layer having a nanotextured surface comprising a plurality of nanofeatures; and a polymeric material at least partially embedded within the nanotextured surface. Nanotextured polymeric materials and layered components produced by various processes.

9 Claims, 9 Drawing Sheets

(51) Int. Cl.
   *B82Y 40/00* (2011.01)
   *C25D 1/00* (2006.01)
   *C25D 5/56* (2006.01)

(56) References Cited

U.S. PATENT DOCUMENTS

| | | |
|---|---|---|
| 2008/0075954 A1 | 3/2008 | Wardle et al. |
| 2009/0233124 A1 | 9/2009 | Berg et al. |
| 2010/0066346 A1* | 3/2010 | Zhang .................... C25D 11/12 428/167 |
| 2014/0374268 A1* | 12/2014 | Wu ...................... C25D 11/045 205/118 |
| 2015/0300980 A1 | 10/2015 | Kim et al. |
| 2016/0251769 A1* | 9/2016 | Silverman .............. C25D 1/006 428/601 |
| 2016/0268131 A1 | 9/2016 | Kwon et al. |
| 2018/0282890 A1* | 10/2018 | Chun ................. C23C 18/1651 |

\* cited by examiner

SACRIFICIAL NANOTRANSFER LITHOGRAPHY FOR THE METALIZATION OF PLASTICS

CROSS-REFERENCE TO RELATED APPLICATION

This application is a 371 national stage application of PCT Application No. PCT/2020/35905, filed Jun. 3, 2020, which claims the benefit of United States Provisional Patent Application No. 62/856,426, filed Jun. 3, 2019, titled SACRIFICIAL NANOTRANSFER LITHOGRAPHY FOR THE METALIZATION OF PLASTICS, which is incorporated by reference herein in its entirety.

BACKGROUND

Utilizing solid metal parts for some applications can be cost prohibitive. For other applications, solid metal parts may not provide the desired properties. For example, solid metal parts may be too heavy or too rigid. In such situations it may be preferable to coat a base material having desirable properties with a metal coating.

Metallizing is the general name for the technique of coating metal on the surface of objects. Metallic coatings may be decorative, protective, and/or functional. Techniques for metallization started as early as mirror making One process for metallizing objects is electroplating. Electroplating is a process that uses an electric current to reduce dissolved metal cations so that they form a thin coherent metal coating on an electrode.

Without admitting such challenges to have been understood or even recognized prior to the present disclosure, durable metallization of plastic has been a challenge in the manufacturing of lightweight conductive surface composites. As used herein, "plastic" refers to a broad class of materials including synthetic or semi-synthetic organic compounds that are malleable and so can be molded into solid objects. The term "plastic" is intended to include all types of polymers, copolymers, and composites, including but not limited to thermoplastic polymers, thermosetting polymers, amorphous polymers, crystalline polymers, conductive polymers, biodegradeable polymers, bioplastics, and resins.

Three dominant categories of plastic metallization techniques include: (1) resin backing of foils, (2) vacuum-based approaches, and (3) electro(less)-plating. Resin backing of foils is a facile approach to metallization, but requires the handling of thin metal foils, which can easily crease or tear, thus restricting the method primarily to flat surfaces and also often including a large amount of parasitic mass in overly or excessively thick coatings. Vacuum approaches suffer from poor interfacial adhesion and are susceptible to flaking and/or may require the use of specialized proprietary chemistries. Electro(less)-plating also requires specific chemistry or pretreatment and delivers variable results depending on the variety of the polymer being treated.

It has been recognized and discovered that a need exists for methods of metallization of plastics and for metallized plastics having a metallic coating that exhibits improved durability, adhesion, and uniformity. As used herein, the term "durability" means the ability to withstand wear, pressure, or damage. As used herein, the term "adhesion" means the action or process of adhering to a surface or object. As used herein, the term "uniformity" refers to the degree to which a coating covers all facets of a surface at a consistent thickness and with a consistent degree of adhesion. In the context of a metallic coating applied to a plastic, "durability" and "adhesion" may be quantified, at least in part, by known measurements for testing adhesion, including but not limited to ASTM C1583, ASTM D4541, and ASTM D7234-12.

BRIEF SUMMARY

Various embodiments relate to a process for producing a layered component. The process may include depositing a strike layer on a substrate; forming a nanomaterial layer on the strike layer, the nanomaterial layer having a nanotextured surface comprising a plurality of nanofeatures; embedding a polymeric material at least partially within the nanotextured surface; and separating the strike layer from the substrate to obtain the layered component.

Other embodiments relate to a layered component that includes a nanomaterial layer having a nanotextured surface comprising a plurality of nanofeatures; and a polymeric material at least partially embedded within the nanotextured surface.

Still other embodiments relate to a nanotextured polymeric material produced by a process that may include depositing a strike layer on a substrate; growing a nanomaterial layer on the strike layer, the nanomaterial layer having a nanotextured surface comprising a plurality of nanofeatures; embedding a polymeric material at least partially within the nanotextured surface; separating the strike layer from the substrate to obtain the layered component; and etching one selected from the group consisting of the strike layer, the nanomaterial layer, and a combination thereof.

BRIEF DESCRIPTION OF THE DRAWINGS

Many aspects of this disclosure can be better understood with reference to the following figures, in which.

It should be understood that the various embodiments are not limited to the examples illustrated in the figures.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements at the time of this writing. Furthermore, unless otherwise clear from the context, a numerical value presented herein has an implied precision given by the least significant digit. Thus, a value 1.1 implies a value from 1.05 to 1.15. The term "about" is used to indicate a broader range centered on the given value, and unless otherwise clear from the context implies a broader range around the least significant digit, such as "about 1.1" implies a range from 1.0 to 1.2. If the least significant digit is unclear, then the term "about" implies a factor of two, e.g., "about X" implies a value in the range from 0.5× to 2×, for example, about 100 implies a value in a range from 50 to 200. Moreover, all ranges disclosed herein are to be understood to encompass any and all sub-ranges subsumed therein. For example, a range of "less than 10" for a positive only parameter can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Additional details for several embodiments are described in the Appendices, attached hereto. Any statement made in any appendix applies only to the embodiment in that appendices and not to other embodiments described elsewhere, unless specifically repeated.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. Throughout this specification and the claims, unless the context requires otherwise, the word "comprise" and its variations, such as "comprises" and "comprising," will be understood to imply the inclusion of a stated item, element or step or group of items, elements or steps but not the exclusion of any other item, element or step or group of items, elements or steps. Furthermore, the indefinite article "a" or "an" is meant to indicate one or more of the item, element or step modified by the article.

Various embodiments relate to combinations of sacrificial nanoimprint lithography (SNT) and transfer printing to create metalized, oxidized, or porous polymer surfaces.

According to various embodiments, one or more metal layers, also referred to herein as "strike layer(s)", may be applied to a substrate. The substrate may be a mold. The substrate may be any suitable material, including for example a metal. The metal may be selected from the group including, brass alloys, steel alloys, aluminum alloys, and titanium alloys. The substrate material may be selected such that the metal layer may be easily removed from the substrate upon completion of the process physically (e.g. polishing), chemically (e.g. etching), or thermally (e.g. combustion). The substrate may include a material selected from steel, brass, aluminum, a metalized plastic, a metalized ceramic, or any combinations thereof. Those having ordinary skill in the art will understand that any number of metal layers may be applied and that each layer may cover all or a portion of the substrate or previous layer(s). The metal layer may also be applied in a pattern.

According to various embodiments, a nanomaterial layer, may be grown on the metal layer. As used herein the term "nanomaterial" refers generally to a material having one or more nanofeatures. The one or more nanofeatures may be a nanotexture on a surface of the nanomaterial. A nanofeature is a structure having at least one dimension, such as a length, width, height, diameter, thickness, or depth, less than 1000 nm in size and may include nanofeatures. A nanofeature may have at least one dimension within a range having a lower limit and/or an upper limit. The range may include or exclude the lower limit and/or the upper limit. The lower limit and/or upper limit can be selected from about 1, 5, 10, 20, 30, 40, 50, 60, 70, 80, 90, 100, 125, 150, 175, 200, 225, 250, 275, 300, 325, 350, 375, 400, 425, 450, 475, 500, 525, 550, 575, 600, 625, 650, 675, 700, 725, 750, 775, 800, 825, 850, 875, 900, 925, 950, 975, and 1000 nm. For example, according to certain embodiments, a nanofeature may have at least one dimension in a range of from about 1 to about 100 nm, or any combination of lower limits and upper limits described. The nanofeatures may include nanorods, nanosheets, nanobumps, nanocracks, and/or nanoholes.

Growing the nanomaterial layer on the metal layer may result in the metal layer being partially or completely consumed. According to various embodiments, the nanomaterial layer may be grown by a seeding approach that results in a nanomaterial layer that forms an alloy and/or mixed oxide layer with the metal layer that possesses a physical bond, such as Ag—Cu, Au—Cu, Cu—Cu, Cu—CuO, Au—CuO, CuO—ZnO, AgO—ZnO, AuO—ZnO, AlO—ZnO, CuO—NiO, AgO—NiO, AuO—NiO, AlO—NiO, and Au—Si. As will be readily understood by those having ordinary skill in the art, any number of nanomaterial layers may be grown. According to various embodiments, several nanomaterial layers may be layered. Other layers may, of course, be disposed between multiple nanomaterial layers.

The nanomaterial layer may further comprise a nanostructured or nanotextured surface on a side opposed to the nanomaterial-metal interface. The nanostructured or nanotextured surface may include a plurality of nanofeatures, such as, for example, a plurality of nanorods, which may be impregnated with a polymeric or polymerizable material. As used herein, the term "polymeric material" is intended to include both a polymeric material and a material or combinations of materials that are polymerizable. The polymeric or polymerizable material may include polymers or oligomers formed thermoplastically or crosslinked with chemical additives, such as, for example polylactic acid, acrylonitrile butadiene styrene copolymer, nylons, polyethylene terephthalate, high-density polyethylene, polycarbonate, thermoplastic and thermoset urethane, poly(ethylene glocol) diacrylate (PEGDA), 1,6-hexanediol diacrylate, poly(ethylene glocol) dimethacrylate, poly acrylic acid, poly(N-isopropylacrylamide), polyacrylamide, tert-butyl acrylate, bisphenol A ethoxylate, dimethacrylate, bisphenol A ethoxylate diacrylate, benzyl methacrylate, poly(urethane) acrylate, di(ethylene glycol) dimethacrylate, gelatin, alginate, chitosan, chitosan. As will be understood by according to various embodiments, the polymeric or polymerizable material may be one or more monomers capable of forming a polymer material. The polymeric material may be the material that will provide the structure or shape of the final component. At least some of the nanofeatures, such as, for example, nanorods, may extend into the polymeric material providing surface area for strengthened mechanical bonding to the polymeric material. The mechanical bonding between the nanofeatures and the polymeric material may be further strengthened in embodiments in which the polymeric material is subsequently cured. The bonding may also be strengthened in various embodiments by adding chemical bonds between the nanomaterial and polymer layer during the curing process.

According to some embodiments, not all of the metal layer is converted into the nanomaterial layer, but instead remains to provide a durable metal-oxide bond and the properties of a metal. These properties may include, but are not limited to high electrical and thermal conductivity, low thermal emissivity, high optical reflectivity, and high mechanical durability. According to other embodiments, all of the metal layer is converted into the nanomaterial layer to result in a complete oxide layer. Regardless of whether the metal layer is partially or completely consumed, the resulting structure may be used as is, may be coated with an additional metal layer, and/or may be etched with an etchant that selectively removes the metal and/or the oxide layer, leaving a nanotextured surface in the polymeric material. The nanotextured surface may result from etching away the nanorods to expose cavities in the polymeric material in which the nanorods were previously disposed.

An example of a process of sacrificial nanotransfer (SNT) up to the point of molding, according to various embodiments, is illustrated schematically in FIGS. 1A, 1B, 1C, 1D, 2A, 2B, 2C, and 2D.

Figure 1A:
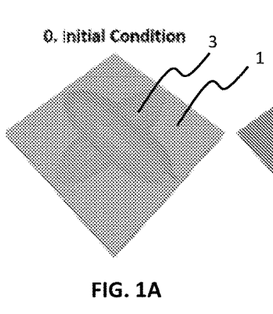
FIG. 1A: is an example according to various embodiments, illustrating a macro-scale perspective view of a substrate, specifically a metal mold.
Figure 2A:
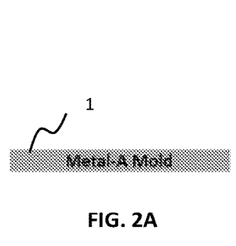
FIG. 2A: is an example according to various embodiments, illustrating a nano-scale, cross-sectional view of the mold shown in FIG. 1A.

FIG. 1A is an example according to various embodiments, illustrating a macro-scale perspective view of a substrate, specifically a metal mold. FIG. 2A is an example according to various embodiments, illustrating a nano-scale, cross-sectional view of the mold shown in FIG. 1A. As illustrated in FIG. 1A, the metal mold 1 may have an internal cavity 3. The metal mold 1 may comprise a metallic material, which is referenced herein as "metal-A." The mold 1 may comprise any suitable metal, such as, for example: 1008/1010 steel and/or SS316 stainless steel. The mold may comprise steel, brass, aluminum, or any combination thereof. For some applications, steel may be desirable for its hardness, brass may be desirable for its thermal conductivity, and aluminum may be desirable for its low-cost and scalability. In some embodiments, the mold may be a plastic or ceramic metalized either via this or another process that enhances surface conductivity. The substrate may be a mold, as shown, or may be a mandrel for a thermoset, thermoplastic, or laminate, or alternatively a shim or foil that may be included as one layer of a laminate. Unlike foil used in resin backing, this foil will not be a part of the final component, and may, therefore, be selected for requisite stiffness or other properties.

Figure 1B:
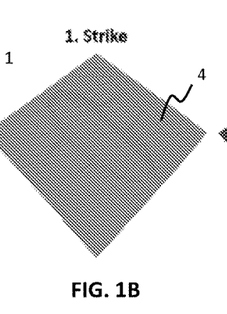
FIG. 1B: is an example according to various embodiments, illustrating a macro-scale perspective view of the metal mold of FIG. 1A coated with a metallic coating.
Figures 2B, 2C, 2D:
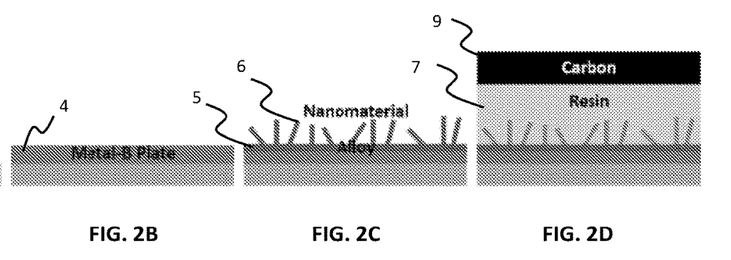
FIG. 2B: is an example according to various embodiments, illustrating a nano-scale, cross-sectional view of the mold and layers shown in FIG. 1B.
FIG. 2C: is an example according to various embodiments, illustrating a nano-scale, cross-sectional view of the mold and layers shown in FIG. 1C.
FIG. 2D: is an example according to various embodiments, illustrating a nano-scale, cross-sectional view of the mold and layers shown in FIG. 1D.

FIG. 1B is an example according to various embodiments, illustrating a macro-scale perspective view of the metal mold of FIG. 1A coated with a metallic coating. FIG. 2B is an example according to various embodiments, illustrating a nano-scale, cross-sectional view of the mold and layers shown in FIG. 1B. A "strike" electroplate 4 comprising a metallic material may be applied to the substrate, such as the mold 1. The metallic material of the strike electroplate is referred to as "metal-B" herein. The metallic material may be any suitable metallic material. Although only a single strike layer is illustrated, those having ordinary skill in the art will appreciate that multiple strike layers may be utilized and/or that different sections of the substrate may be coated with different single or multi-layered strike materials. For example, according to various embodiments, the metallic material may be copper, gold, nickel, aluminum, or any combination thereof. Copper may be desirable for its scalability and conductivity. Gold may be desirable for its inertness. Nickel may be desirable for electroless applications. Electroless plating, also known as chemical or autocatalytic plating, is a non-galvanic plating method that involves several simultaneous reactions in an aqueous solution, which occur without the use of external electrical power. It is mainly different from electroplating by not using external electrical power. Aluminum may be desirable for its scalability and reflectivity. In certain embodiments, this layer may be deposited via another method, such as chemical vapor deposition, atomic layer deposition, or thermal evaporation.

The strike layer or the strike plate 4 may have a thickness within a range having a lower limit and/or an upper limit. The range may include or exclude the lower limit and/or the upper limit. The lower limit and/or upper limit can be selected from about 0.1, 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, and 15 µm. For example, according to certain embodiments, the strike layer may have a thickness of from about 0.1 µm to about 10 µm, or any combination of lower limits and upper limits described. The strike layer or the strike plate 4 may serve as the basis for a future plating. Among other criteria, the metallic material (metal-B) may be selected to be a poor plating material for the metal mold material (metal-A). In other words, metal-A and metal-B may be a combination of metals lacking alloys that readily form electrochemically. Copper as metal-B and iron as metal-A, aluminum as metal-B and iron as metal-A, and aluminum as metal-B and brass as metal-A are three such pairs.

Figure 1C:
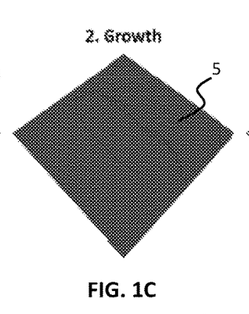
FIG. 1C: is an example according to various embodiments, illustrating a macro-scale perspective view of the metallized mold of FIG. 1B after a nanomaterial and mixed oxide layer has been grown on the metallic coating.

FIG. 1C is an example according to various embodiments, illustrating a macro-scale perspective view of the metallized mold of FIG. 1B after a nanomaterial and alloy/mixed oxide layer has been grown on the metallic coating. FIG. 2C is an example according to various embodiments, illustrating a nano-scale, cross-sectional view of the mold and layers shown in FIG. 1C. A nanomaterial 5 may be grown in a seeded manner from the strike 4. For example, according to various embodiments, the hydrothermal growth of zinc oxide may be employed to form the nanomaterial. Much as with electroplating, hydrothermal growth is sensitive to the bath temperature and composition of the growth medium, but, unlike electroplating, hydrothermal growth is a continuous, thermodynamic chemical reaction, making it more difficult to control the rate of the process. According to various embodiments, a seeded approach results in nanomaterial that forms an alloy or mixed oxide layer with the strike layer that possesses a physical bond, such as Ag—Cu, Au—Cu, Cu—Cu, Cu—CuO, Au—CuO, CuO—ZnO, AgO—ZnO, AuO—ZnO, AlO—ZnO, CuO—NiO, AgO—NiO, AuO—NiO, AlO—NiO, and Au—Si. According to various embodiments uniform growth may be obtained by optimizing conditions for a slow, controlled reaction. Different reaction conditions also affect the morphology of the nanomaterials that are grown, which in turn may affect the adhesion of the plastic material 7 to the nanomaterial 5. According to various embodiments, the presence of an alloy/mixed oxide layer between the nanomaterial 5 and the strike 4 combined with the absence of an alloy/mixed oxide layer between the strike 4 and the metal mold 1 may result in an easy separation of the strike 4 from the metal mold 4, while the physical bond between the nanomaterial 5 and the strike 4 is preserved. According to various embodiments the nanomaterial 5 may have a textured surface, including a plurality of voids defined between a plurality of nanorods 6. Uniformity and strength of adhesion may be evaluated using a commercial pressure-based adhesion gauge following ASTM C1583, ASTM D4541, and ASTM D7234-12, which employs negative pressure to locally test the adhesion of films. The nanomaterial may be any suitable material, including but not limited to zinc oxide, copper, and combinations thereof. Zinc oxide may be desirable for certain applications due to its scalability. Copper may be desirable for its conductivity.

In other embodiments, the nanomaterial may be formed by electrochemical etching of the copper strike into nanowires, electrochemical deposition of copper on copper to form a homogenous bond layer, electrochemical deposition of zinc metal onto copper or another plated layer, and then hydrothermal or electrochemical growth of zinc oxide, chemical vapor deposition of zinc oxide onto gold, silver, or copper, or chemical vapor deposition of silicon onto gold with a gold-silicon alloy interface.

Figure 1D:
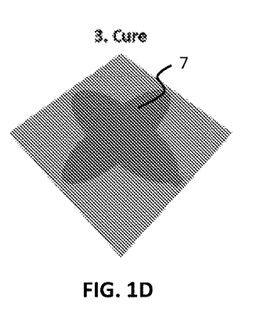
FIG. 1D: is an example according to various embodiments, illustrating a macro-scale perspective view of the mold of FIG. 1C after a plastic material impregnated into carbon fiber has been embedded into the nanomaterial and mixed oxide layer has been formed on the plastic material after curing.

FIG. 1D is an example according to various embodiments, illustrating a macro-scale perspective view of the mold of FIG. 1C after a plastic material impregnated into a carbon fiber material has been embedded into the nanomaterial and a layer of alloy or mixed oxide. FIG. 2D is an example according to various embodiments, illustrating a nano-scale, cross-sectional view of the mold and layers shown in FIG. 1D. A plastic material 7 may be applied to the nanomaterial layer 5. The plastic material 7 may be any suitable material, including but not limited to a resin material, an impregnated laminate, such as coated carbon fiber 9, or a cross-linkable polymer. The plastic material may be curable. Curing is a chemical process employed in polymer chemistry and process engineering that produces the toughening or hardening of a polymer material by cross-linking of polymer chains. As used herein "curable" refers to a plastic material that may undergo curing. The plastic material may also be hardenable. A thermoplastic polymer, for example, may be flowable at an elevated temperature and hardenable at a lower temperature. The plastic material 7 may be applied such that it impregnates the textured surface by at least partially filling at least some of the plurality of voids defined between the plurality of nanorods 6. The plastic material 7 may be hardened or cured in contact with the nanomaterials, such that the nanomaterials embed into the top layer of the cured material 7. While, according to some embodiments, the curing process does not create a primary bond, there is a large enhancement of secondary bonding due to amplified surface area and mechanical bonding due to re-entrant geometries. The plastic material 7 may optionally fill the internal cavity 3 of the metal mold 1 to provide the structure of the resulting component or object.

After these steps, the component may be removed as usual from the mold 1 and the mold 1 may be reused. According to various embodiments, metal-A and metal-B may be selected such that the metal coating will possess less interfacial and mechanical adhesion to the mold 1 than the component and will remain with the component. The component may then be post-processed in various ways. FIGS. 3A, 3B, 3C, 3D, 4A, 4B, 4C, and 4D illustrate various post-demolding processing techniques that may be employed according to various embodiments.

Figure 3A:
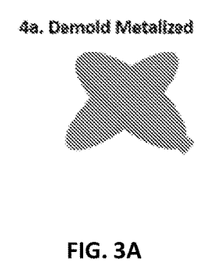
FIG. 3A: is an example according to various embodiments, illustrating a macro-scale perspective view of a demolded component, removed from the mold illustrated in FIGS. 1D and 2D and having both a residual strike layer and nanomaterial layer, the strike layer having only been partially converted into the nanomaterial layer.
Figure 4A:
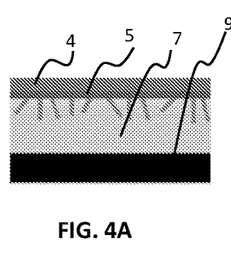
FIG. 4A: is an example according to various embodiments, illustrating a nano-scale, cross-sectional view of the component illustrated in FIG. 3A.

FIG. 3A is an example according to various embodiments, illustrating a macro-scale perspective view of a demolded component, removed from the mold illustrated in FIGS. 1D and 2D and having both a residual strike layer 4 and nanomaterial layer 5, the strike layer 4 having only been partially converted into the nanomaterial layer 5. FIG. 4A is an example according to various embodiments, illustrating a nano-scale, cross-sectional view of the component illustrated in FIG. 3A. According to various embodiments, the demolded part can be used as received with the nanoscale strike metal coating 4.

Figure 3B:
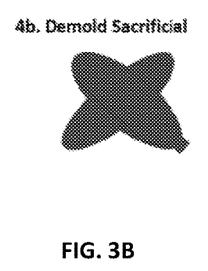
FIG. 3B: is an example according to various embodiments, illustrating a macro-scale perspective view of a demolded component, removed from the mold illustrated in FIGS. 1D and 2D and having only a nanomaterial layer, the strike layer having been fully converted into the nanomaterial layer.
Figure 4B:
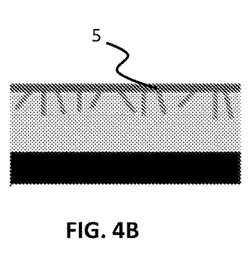
FIG. 4B: is an example according to various embodiments, illustrating a nano-scale, cross-sectional view of the component illustrated in FIG. 3B.

FIG. 3B is an example according to various embodiments, illustrating a macro-scale perspective view of a demolded component, removed from the mold illustrated in FIGS. 1D and 2D and having only a nanomaterial layer 5, the strike layer 4 having been fully converted into the nanomaterial layer. FIG. 4B is an example according to various embodiments, illustrating a nano-scale, cross-sectional view of the component illustrated in FIG. 3B. According to various embodiments, the strike layer 4 may be thin enough that the whole thickness is converted to an alloy or mixed oxide material when the nanomaterial 5 is grown in a seeded manner from the strike 4. For example, according to various embodiments, the hydrothermal growth of zinc oxide may utilize the entirety of the strike layer 4 to grow the nanomaterial layer 5. According to such embodiments, the nanomaterial layer 5 may be present at the surface as a sacrificial oxide layer, which may also be used as a barrier to corrosion or fouling.

According to various embodiments, the initial finish of the process mimics the substrate from which it is grown. Therefore, according to various embodiments it is possible to use the hardness of stainless steel to hold a mirror polish in the mold and transfer it to the final component.

Figure 3C:
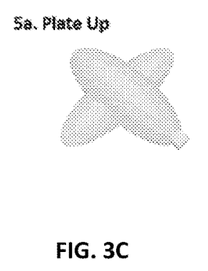
FIG. 3C: is an example according to various embodiments, illustrating a macro-scale perspective view of the demolded component illustrated in FIG. 3A having an additional metallized surface layer.
Figure 4C:
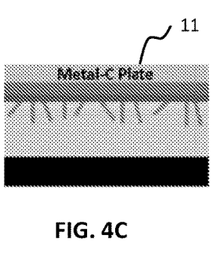
FIG. 4C: is an example according to various embodiments, illustrating a nano-scale, cross-sectional view of the component illustrated in FIG. 3C.

FIG. 3C is an example according to various embodiments, illustrating a macro-scale perspective view of the demolded component illustrated in FIG. 3A having an additional metallized surface layer 11. FIG. 4C is an example according to various embodiments, illustrating a nano-scale, cross-sectional view of the component illustrated in FIG. 3C. If a metalized surface from residual strike layer 4, is presented, this may then be used as the basis for "plating-up" or "depositing by electroplating" a "metal-C" into a thicker metallized surface layer or coating 11. The additional metallized surface layer may comprise any suitable metallic material, including but not limited to bright acid copper, copper, gold, silver, nickel, aluminum, or any combination thereof. Copper may be desirable for its conductivity. Gold may be desirable for its inertness. Silver may be desirable for its reflectivity. Nickel may be desirable for its magnetism. Aluminum may be desirable for its reflectivity. Any or all of these materials may be desirable for their aesthetic appeal. The additional metallized surface layer may have any desired thickness. The additional metallized surface layer may have a thickness within a range having a lower limit and/or an upper limit. The range may include or exclude the lower limit and/or the upper limit. The lower limit and/or upper limit can be selected from about 1, 5, 10, 15, 20, 25, 30, 35, 40, 45, 50, 55, 60, 65, 70, 75, 80, 85, 90, 95, and 100 μm. For example, according to certain embodiments, the additional metallized surface layer may have a thickness of about 3 μm to about 50 μm, or any combination of lower limits and upper limits described.

Figure 3D:
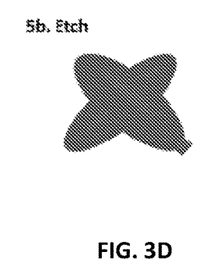
FIG. 3D: is an example according to various embodiments, illustrating a macro-scale perspective view of a demolded component illustrated in either of FIG. 3A or 3B after etching of the nanomaterial layer and optionally any residual strike layer.
Figure 4D:
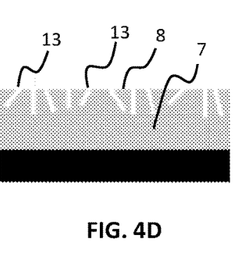
FIG. 4D: is an example according to various embodiments, illustrating a nano-scale, cross-sectional view of the component illustrated in FIG. 3D.

FIG. 3D is an example according to various embodiments, illustrating a macro-scale perspective view of a demolded component illustrated in either of FIG. 3A or 3B after etching of the nanomaterial layer and optionally any residual strike layer. FIG. 4D is an example according to various embodiments, illustrating a nano-scale, cross-sectional view of the component illustrated in FIG. 3D. The metal layer 4 and/or the nanomaterial layer 5, which according to some embodiments may be considered to be a sacrificial oxide layer, can be etched with an etchant to leave a porous surface 8 having a plurality of nanoscale voids 13. The etchant may be any suitable solvent or solution. Zinc oxide, in particular, is amphoteric and can be easily etched in mild acids or bases. As used herein, amphoteric refers to a compound, especially a metal oxide or hydroxide) able to react both as a base and as an acid. Particularly for embodiments involving a sacrificial nanomaterial layer it may be desirable to utilize an amphoteric material to facilitate a broad range of etchant options.

Various embodiments may be optimized for the fabrication of sub-cm scale samples. Such embodiments typically provide a maximum part size of about 6 inches by about 10 inches. According to some embodiments diminishing quality may be seen in larger parts, such as edge effects, ungrown regions, and non-uniformity due to diffusion. Therefore, various embodiments relate to a multi-bath electroplating system comprising at least one bath customized for hydrothermal growth. Such embodiments may provide better quality for larger parts. In addition, to the steel/copper/zinc oxide/copper platform discussed according to various embodiments, the substrate material or plate-up material may be adjusted to meet a variety of requirements. Other materials may be employed. Table 1 provides several non-limiting examples of some other materials that may be employed according to various embodiments as well as advantages that may be provided by the materials.

TABLE 1

Materials selection for SNT, with key properties in parentheses.

| Metal-A | Metal-B | Nanomaterial | Metal-C |
|---|---|---|---|
| steel (hardness), brass (thermal conductivity), aluminum (scalability) | copper (scalability), gold (inertness), nickel (electroless) | zinc oxide (scalability, function), copper (conductivity) | copper (conductivity), gold (inertness), silver (reflectivity), nickel (magnetism). |

Various embodiments provide new methods to metalize formed plastic parts. The methods according to various embodiments provide new routes to providing durable metallization of plastics that are more scalable than existing approaches. Various embodiments have the potential to impact a wide range of industries, particularly where lightweight objects with metal or oxide surface functionality is desirable. Various embodiments provide a scalable way to coat patterned or large metal coatings onto plastics, including high-value mass manufactured components.

Carbon-fiber parts for automotive and aerospace applications may benefit greatly from various embodiments. For example, metalized (such as, chrome-plated) carbon fiber may be manufactured, according to various embodiments, without adding much weight. The metallized carbon fiber materials, according to various embodiments, provide great benefits to the automotive industry. According to various embodiments it is possible to coat a carbon fiber automobile to make it look like it is made of a more aesthetically desirable metal, such as brushed steel, for example. The ability to metallize carbon fiber with a durable, well-adhered metallic coating facilitates a combination of mechanical properties and aesthetics that is otherwise not available.

Other impacted industries include but are not limited to medical implements and implants, heat dissipation, solar energy and other flexible electronics, optics, automotive, nautical, aerospace vehicles, carbon fiber automotive, aerospace, nautical chassis, medical implements, and printable electronics.

Typically, coatings like epoxies don't take paint well, but metallized surfaces provided by various embodiments take paint very well. The ability to metallize plastics opens a wide variety of potential coating applications. For example, epoxies may swell in water, but metallized coatings do not, thereby providing coatings for electronics capable of functioning even in deep water.

Figure 5:
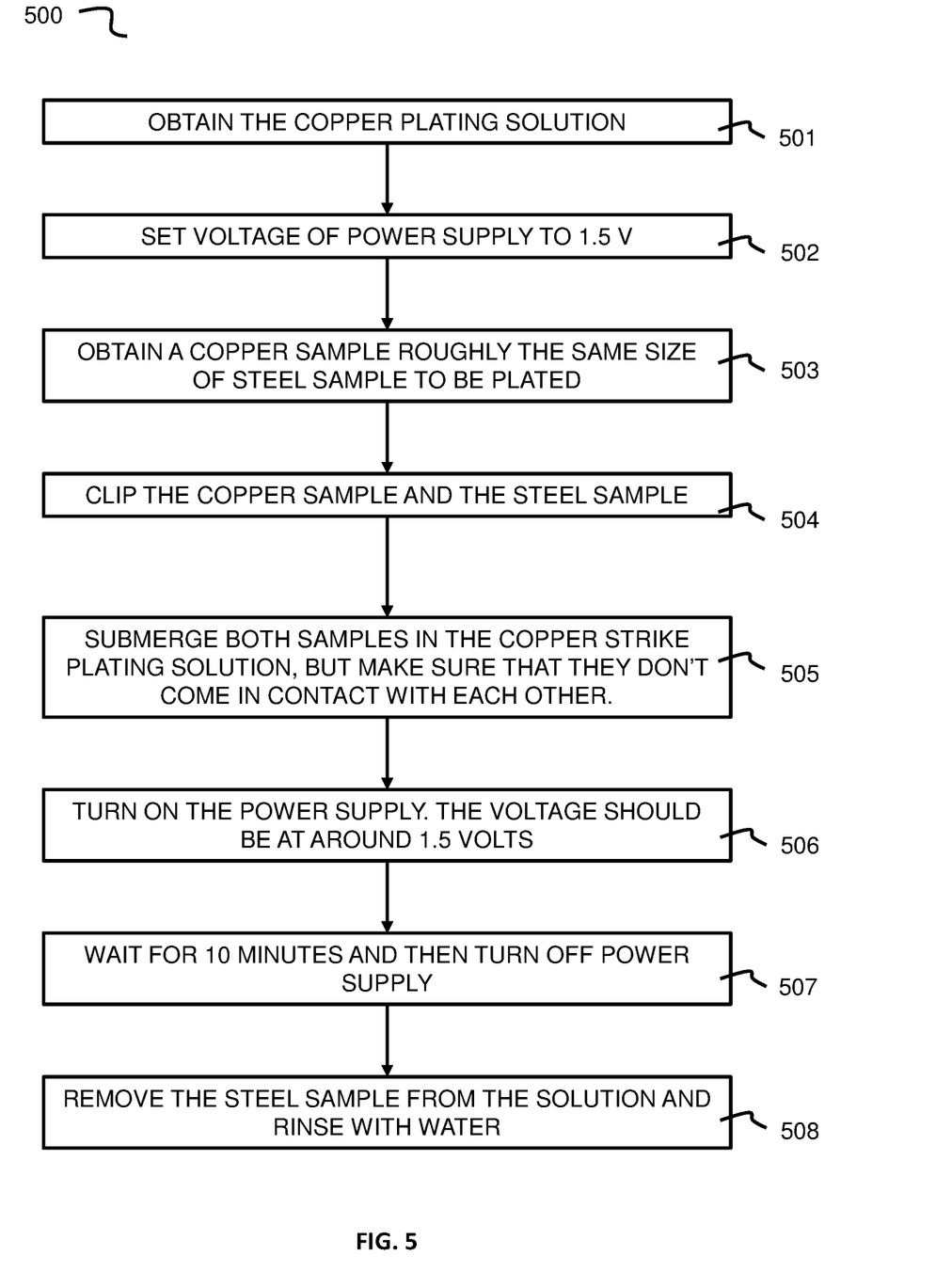
FIG. 5: is an example according to various embodiments, illustrating a flow chart of an electroplating procedure.

FIG. 5 is an example according to various embodiments, illustrating a flow chart of an electroplating procedure 500. All specific material amounts, times, and temperature are exemplary only and do not limit the scope of the invention; a person having ordinary skill in the art will be well equipped to make variations based on this disclosure. At step 501, the method 500 may include obtaining a copper plating solution, such as an EARTHGOLD™ Copper Strike solution (Gesswein), or any other suitable plating solution for forming a strike layer on a substrate. At step 502, the method 500 may include setting a voltage of power supply of an electroplating device to 1.5 V. At step 503, the method 500 may include obtaining a copper sample roughly the same size of steel sample to be plated. At step 504, the method 500 may include clipping the copper sample to the positive electrode (anode) and the steel sample to the negative electrode (cathode). At step 505, the method 500 may include submerging both samples in the copper strike plating solution, while making sure that they do not contact each other. At step 506, the method 500 may include turning on the power supply of the electroplating device. For some electroplating devices, the voltage should be at around 1.5 volts. At step 507, the method 500 may include wait for about 10 minutes and then turning off the power supply. At step 508, the method may include remove the steel sample from the solution and rinse with water. The substrate will be coated with a strike layer, in the particular example, a steel sample will be coated with a layer of copper.

Figure 6:
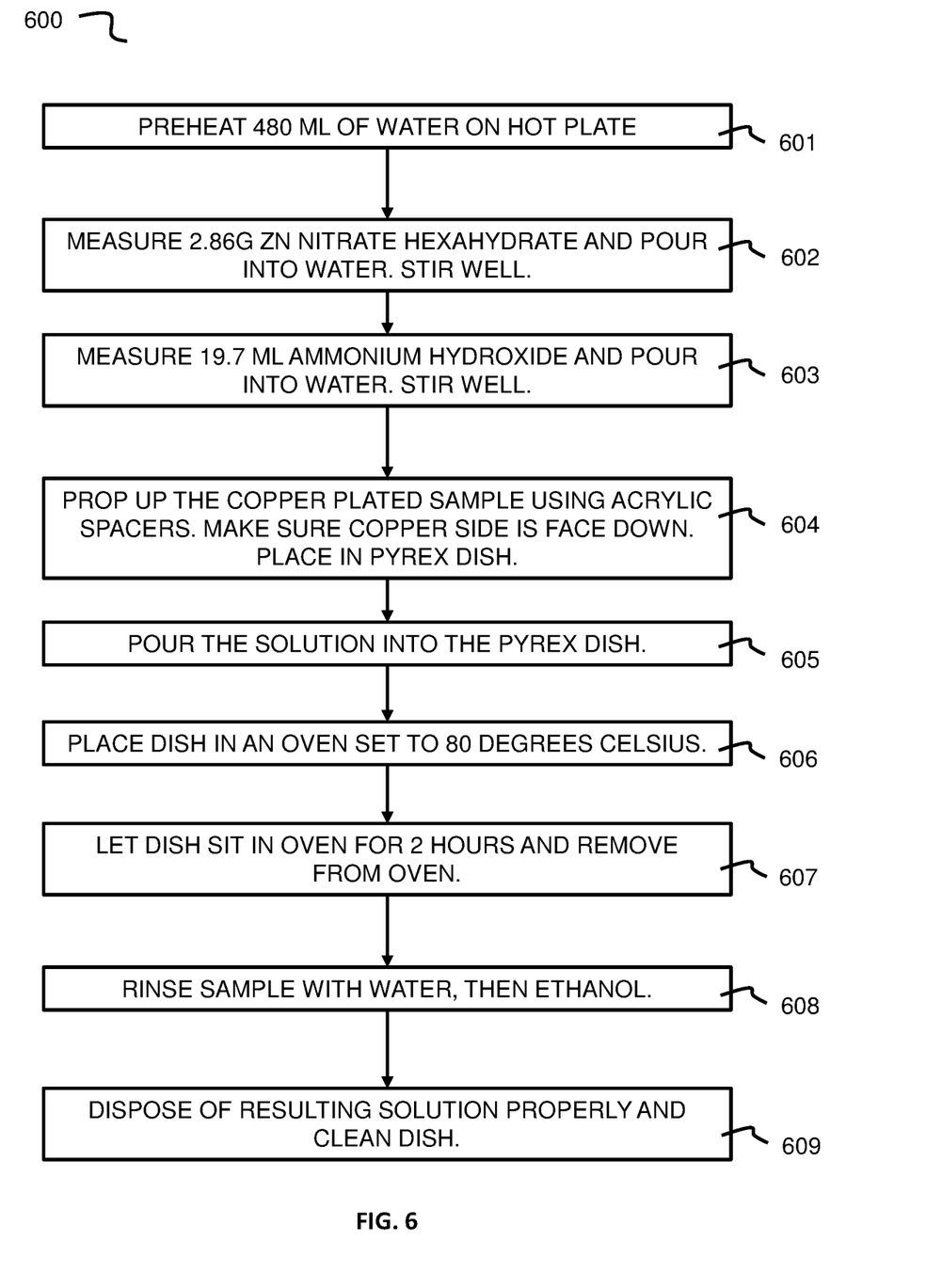
FIG. 6: is an example according to various embodiments, illustrating a flow chart of a nanomaterial growth procedure.

FIG. 6 is an example according to various embodiments, illustrating a flow chart of a nanomaterial growth procedure 600, which may be employed to grow a nanomaterial on the electroplated sample obtain from procedure 500 or any other similar sample. All specific material amounts, times, and temperature are exemplary only and do not limit the scope of the invention; a person having ordinary skill in the art will be well equipped to make variations based on this disclosure. At step 601, the method 600 may include preheating about 480 mL of water on a hot plate, for example by setting a hot plate to 60 degrees Celsius for around 15 minutes. At step 602, the method 600 may include measuring about 2.86 g Zn nitrate hexahydrate (Sigma Aldrich) and pour into the water and stirring well. At step 603, the method 600 may include measuring about 19.7 mL ammonium hydroxide 28%-30% solution (Sigma Aldrich), pouring into the water, and stirring well. At step 604, the method 600 may include propping up the copper plated sample using acrylic spacers, making sure the copper side is face down, and placing in a Pyrex dish. At step 605, the method 600 may include pouring the solution into the Pyrex dish. At step 606, the method 600 may include placing the dish in an oven set to about 80 degrees Celsius. At step 607, the method 600 may include letting the dish sit in oven for about 2 hours and remove from oven. At step 608, the method 600 may include rinsing the sample with water, and then with ethanol. At step 609, the method 600 may include dispose of the resulting solution properly and cleaning the dish.

Figure 7:
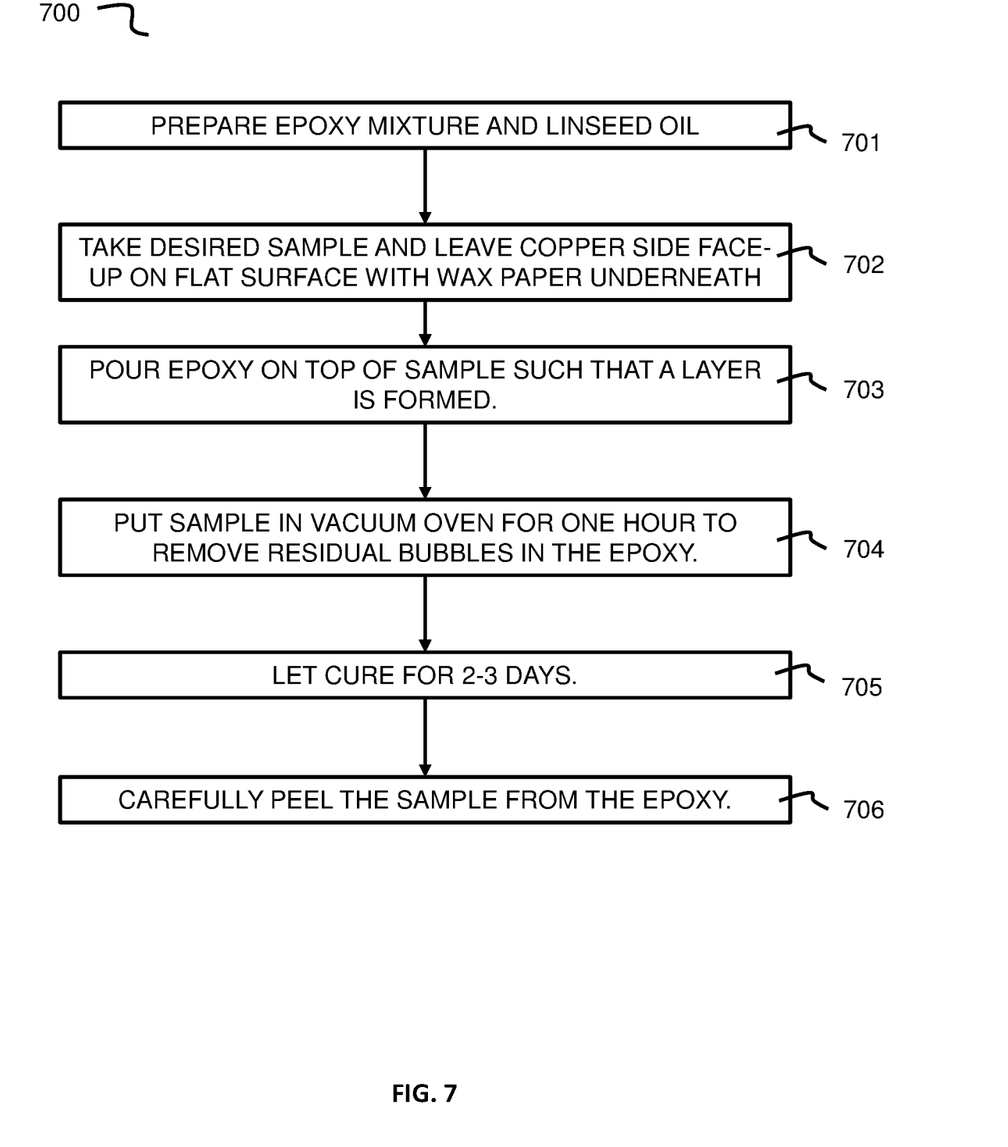
FIG. 7: is an example according to various embodiments, illustrating a flow chart of an epoxy transfer procedure.

FIG. 7 is an example according to various embodiments, illustrating a flow chart of an epoxy transfer procedure 700, which may be employed to apply epoxy to the sample obtained from procedure 600 or any other similar sample. All specific material amounts, times, and temperature are exemplary only and do not limit the scope of the invention; a person having ordinary skill in the art will be well equipped to make variations based on this disclosure.

At step 701, the method 700 may include preparing an epoxy mixture and linseed oil. For example, an epoxy mixture of EPON™ Resin 815C and EPIKURE™ may be employed. EPON™ Resin 815C is a commercially available low-viscosity liquid bisphenol A based epoxy resin containing a commercial grade of n-butyl glycidyl ether. EPIKURE™ is a commercially available epoxy curing agent for use in combination with EPON™ Resin 815C. The ratio of EPON™ Resin 815C to EPIKURE™ may be about 10:4. The epoxy mixture may be mixed using a high-speed mixer. At step 702, the method 700 may include taking a desired sample and leaving the copper side face-up on flat surface with wax paper underneath. At step 703, the method 700 may include pouring epoxy on top of sample such that a layer is formed. At step 704, the method 700 may include putting the sample in a vacuum oven for about one hour to remove residual bubbles in the epoxy. At step 705, the method 700 may include letting the sample cure for about 2 to about 3 days. At step 706, the method 700 may include carefully peeling the sample from the epoxy.

EXAMPLES

The following examples are put forth to provide those of ordinary skill in the art with a complete disclosure and description of how to perform the methods, how to make, and how to use the compositions and compounds disclosed and claimed herein. Efforts have been made to ensure accuracy with respect to numbers (e.g., amounts, temperature, etc.), but some errors and deviations should be accounted for. The purpose of the following examples is not to limit the scope of the various embodiments, but merely to provide examples illustrating specific embodiments. While a majority of these tests have been conducted with thermoset resin, the success of a laminate transfer has also been demonstrated. All of these SNT transfers have passed standard scotch tape test and the coating interface has so far appeared to be more mechanically durable than the substrates.

The experimental procedures employed correspond with those described according to method 500, method 600, and method 700 in FIGS. 5, 6, and 7 respectively Example 1

The SNT process described according to various embodiments was tested using steel and stainless steel shims (metal-A), a copper strike (metal-B), hydrothermally grown zinc oxide (nanomaterial), and copper acid bright (metal-C).

Figure 8A:
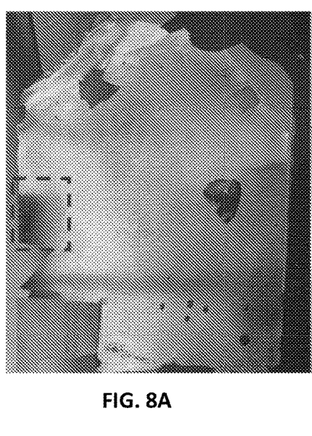
FIG. 8A: is an example according to various embodiments, illustrating a photograph of a demolded component.
Figure 8B:
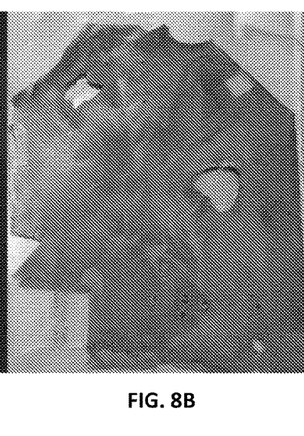
FIG. 8B: is an example according to various embodiments, illustrating a photograph of the component shown in FIG. 8A after being plated-up via a process as illustrated in FIG. 3C.
Figure 8C:
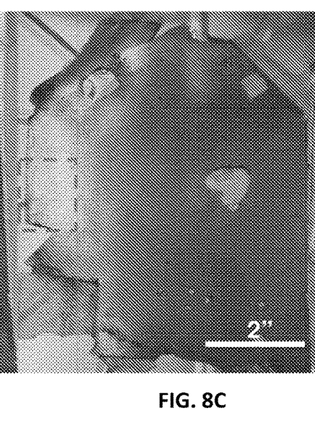
FIG. 8C: is an example according to various embodiments, illustrating the plated-up component of FIG. 8B after polishing.

FIGS. 8A, 8B, and 8C respectively show the sample made after demolding, plating up, and polishing. FIG. 8A is an example according to various embodiments, illustrating a photograph of the demolded component.

It should be noted that holes in the film are from fracture of the epoxy resin, either at the macroscale or microscale, and that some of the regions that appear dark or streaky in the copper, such as the one highlighted in the outlined box, are thickness variations that disappear on additional plating.

Example 2

FIG. 8B is an example according to various embodiments, illustrating a photograph of the component shown in FIG. 8A after being plated-up via a process as illustrated in FIG. 3C. The plating up shown in 8B is done according to method

500, but with the use of EARTHGOLD™ Copper Brite solution (Gesswein) at a voltage of 2.5 V. As an indication of the toughness of this plating, it can be seen that the post plate up image shows a lot of patina, which could be removed by polishing with a great deal of force either by hand or with a rotary polisher.

Example 3

FIG. 8C is an example according to various embodiments, illustrating the plated-up component of FIG. 8B after polishing. After polishing, the coating has a reflective surface with grain that mimics the roughness of the initial steel shim.

Example 4

Figure 9:
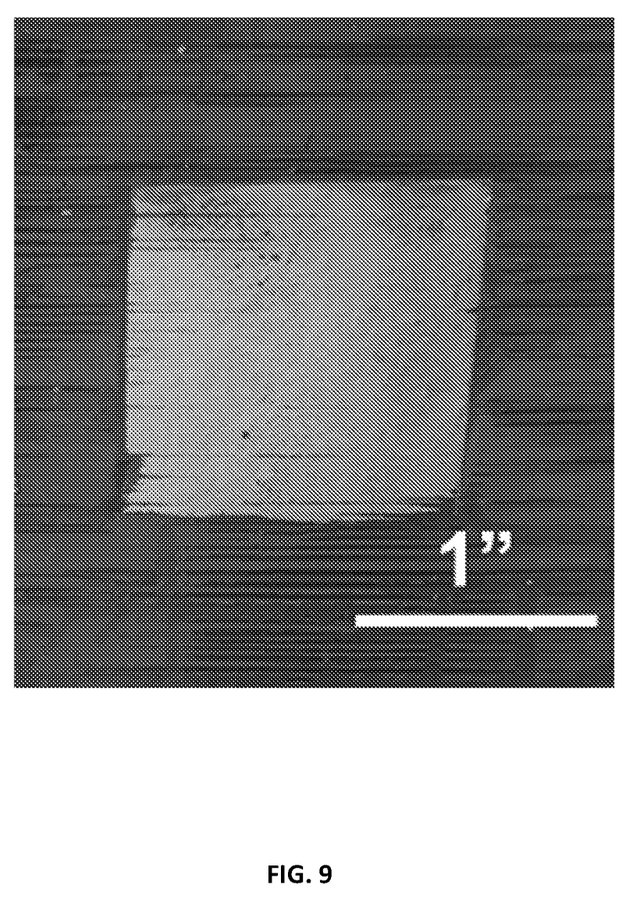
FIG. 9: is an example according to various embodiments, illustrating a photograph of a demolded component with a copper strike on a carbon fiber composite backing.

FIG. 9 is an example according to various embodiments, illustrating a strike and growth sample after transfer into carbon fiber composite. To make this sample, the steel shim prepared by methods 500 and 600 as described in FIG. 5 and FIG. 6 respectively was placed against a stack of 10 8552 Resin/IM7 Fiber Prepreg sheets (Hexcel Hexply 8552). The sheets were arranged in alternating 0 and 90 degree orientations to create a layup. The layup was pressed with a steel roller to remove any air pockets between plies. The whole specimen is then covered with release film on both sides and placed on an aluminum flat curing plate. The edges are surrounded by cork and breather fabric. The cork is to maintain the shape during the vacuum compression and the breather fabric is to facilitate airflow and absorb excess resin. An aluminum top plate is placed on top of everything and the top surface of the curing plate is vacuum sealed with Airtech brand bagging film, sealant tape, with a vacuum valve to maintain vacuum. The whole setup is then placed in the autoclave. The temperature and pressure process is handled automatically by the autoclave to match the supplier recommended heating cycle (as found on the Hexply 8552 data sheet), with the modification of the vacuum pump being left on through the entire cycle. Post-curing, it is then allowed to cool before being removed from the autoclave and removal of the release film and shim.

Example 5

Figure 10:
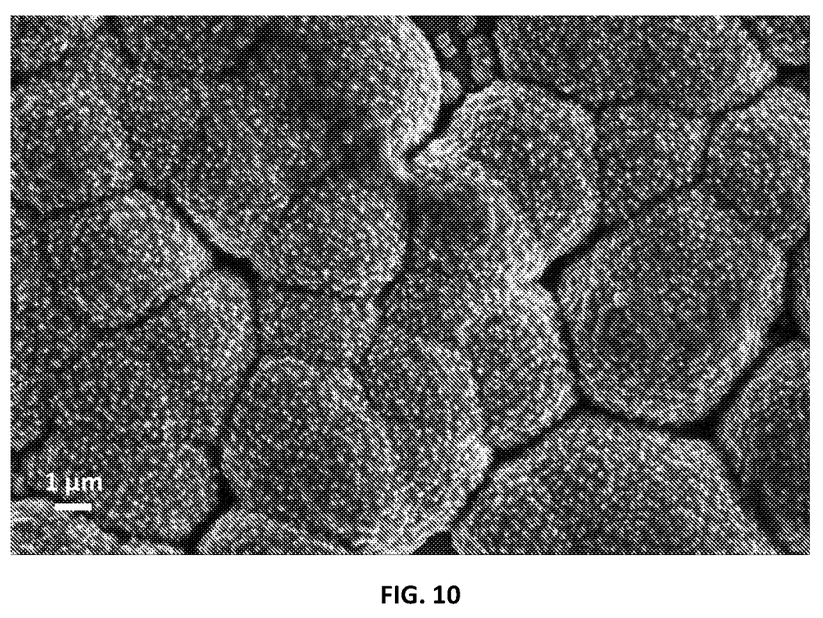
FIG. 10: is an example image illustrating representative ZnO nanostructures according to various embodiments.
Figure 11:
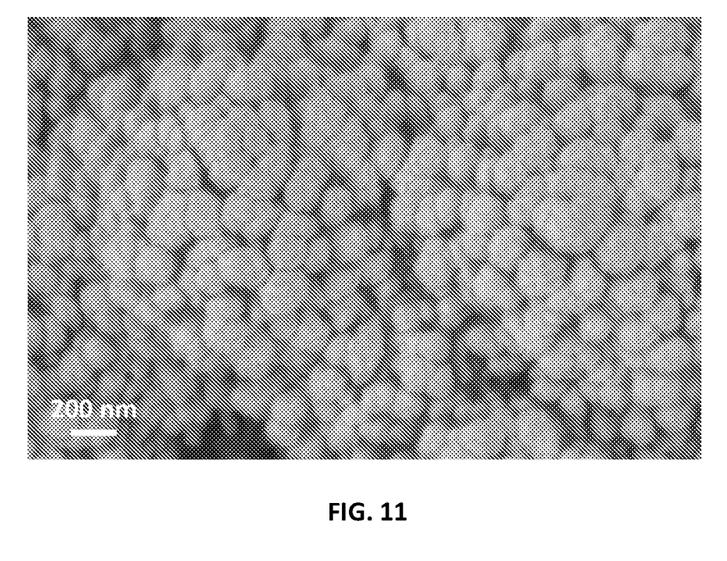
FIG. 11: is an example image illustrating representative ZnO nanostructures according to various embodiments.
Figure 12:
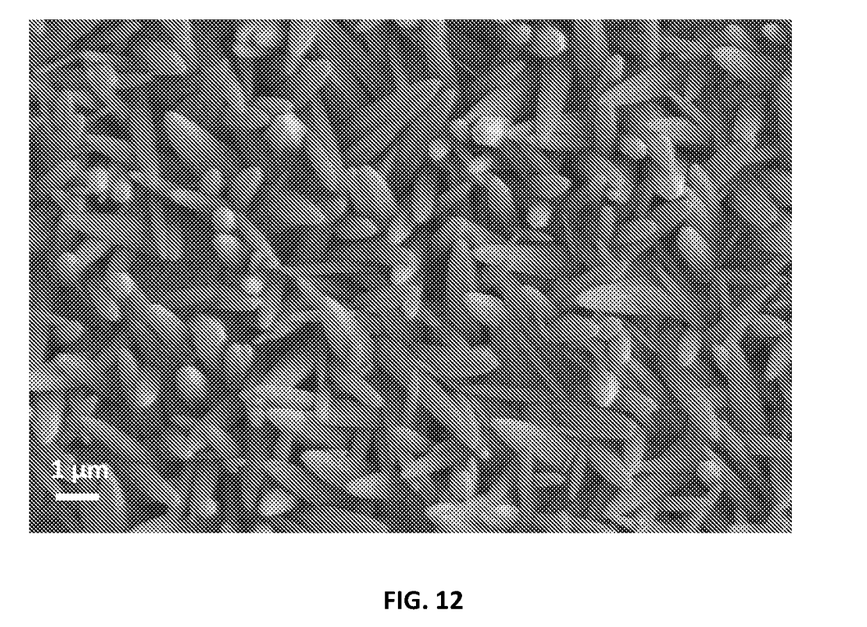
FIG. 12: is an example image illustrating representative ZnO nanostructures according to various embodiments.

A purpose of this example is to provide images showing various ZnO nanostructures according to various embodiments, such as via the procedures described according to method 600 in FIG. 6. FIG. 10 is an example image illustrating representative ZnO nanostructures according to various embodiments using a steel shim prepared through method 500 that is described in FIG. 5. FIG. 11 is an example image illustrating representative ZnO nanostructures according to various embodiments prepared by method 600 on a sheet of Kapton polyimide film that was prepared by sputtering with a gold thin film. FIG. 12 is an example image illustrating representative ZnO nanostructures according to various embodiments prepared by method 600 on a silicon wafer that was prepared by deposition of gold nanoparticles through physical vapor deposition.

What is claimed is:

1. A process for producing a layered component, the process comprising:
    depositing a strike layer on a substrate;
    forming a nanomaterial layer on the strike layer, the nanomaterial layer having nanotextured surface comprising a plurality of nanofeatures;
    embedding a polymeric material at least partially within the nanotextured surface; and
    separating the strike layer from the substrate to obtain the layered component, with at least a portion of the strike layer remaining with the layered component;
    wherein an adhesion between the strike layer and the substrate is weaker than an adhesion between the strike layer and the nanomaterial layer such that a portion of the strike layer remains with the layered component.

2. The process according to claim 1, wherein the plurality of nanofeatures are selected from the group consisting of nanorods, nanosheets, nanobumps, nanoholes, nanocracks, and combinations thereof.

3. The process according to claim 1, wherein the substrate comprises a first metallic material, wherein the strike layer comprises a second metallic material, and wherein the first metallic material and the second metallic material do not form an alloy.

4. The process according to claim 1, wherein forming the nanomaterial layer on the strike layer comprises growing the nanomaterial layer on the strike layer by partially or completely consuming the strike layer to form an alloy or mixed oxide.

5. The process according to claim 4, wherein the alloy or mixed oxide is one selected from the group consisting of Ag—Cu, Au—Cu, Cu—CuO, Au—CuO, CuO—ZnO, AgO—ZnO, AuO—ZnO, AlO—ZnO, CuO—NiO, AgO—NiO, AuO—NiO, AlO—NiO, and Au—Si.

6. The process according to claim 1, wherein forming the nanomaterial layer comprises one selected from the group consisting of etching the strike layer to form the nanomaterial layer, depositing the nanomaterial layer onto the strike layer, and combinations thereof.

7. The process according to claim 1, further comprising etching one selected from the group consisting of the strike layer, the nanomaterial layer, and combinations thereof to expose a nanotextured surface of the polymeric material.

8. The process according to claim 1, further comprising curing the polymeric material.

9. The process according to claim 1, wherein the polymeric material comprises one selected from the group consisting of an epoxy, a urethane, a thermoplastic resin, a thermoset resin, a photoresin, and combinations thereof.

* * * * *